(12) United States Patent
Brun et al.

(10) Patent No.: US 8,445,328 B2
(45) Date of Patent: May 21, 2013

(54) METHOD FOR PRODUCING CHIP ELEMENTS EQUIPPED WITH WIRE INSERTION GROOVES

(75) Inventors: Jean Brun, Champagnier (FR); Régis Taillefer, Le Versoud (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/229,021

(22) Filed: Sep. 9, 2011

(65) Prior Publication Data
US 2012/0064671 A1 Mar. 15, 2012

(30) Foreign Application Priority Data
Sep. 9, 2010 (FR) ...................................... 10 03610

(51) Int. Cl.
*H01L 21/00* (2006.01)
*H01L 23/02* (2006.01)
*H01L 23/52* (2006.01)

(52) U.S. Cl.
USPC ........... 438/121; 438/106; 438/118; 257/678; 257/691

(58) Field of Classification Search
USPC .................................. 438/106–127
See application file for complete search history.

(56) References Cited

U.S. PATENT DOCUMENTS

| | | | |
|---|---|---|---|
| 5,225,373 A * | 7/1993 | Takahashi et al. | 438/51 |
| 5,674,785 A * | 10/1997 | Akram et al. | 438/15 |
| 5,923,535 A * | 7/1999 | Shimada et al. | 361/749 |
| 6,025,648 A | 2/2000 | Takahashi et al. | |
| 6,369,448 B1 | 4/2002 | McCormick | |
| 6,972,244 B1 * | 12/2005 | Patwardhan et al. | 438/462 |
| 7,718,456 B2 * | 5/2010 | Maeda et al. | 438/40 |
| 7,851,906 B2 * | 12/2010 | Alcoe et al. | 257/713 |
| 2002/0053735 A1 * | 5/2002 | Neuhaus et al. | 257/728 |
| 2005/0223552 A1 | 10/2005 | Meyer et al. | |
| 2009/0111206 A1 * | 4/2009 | Luch | 438/59 |
| 2009/0227069 A1 | 9/2009 | Brun et al. | |
| 2011/0001237 A1 * | 1/2011 | Brun et al. | 257/737 |
| 2011/0278736 A1 * | 11/2011 | Lin et al. | 257/774 |
| 2012/0171802 A1 * | 7/2012 | Luch et al. | 438/64 |

FOREIGN PATENT DOCUMENTS

| | | |
|---|---|---|
| EP | 2 099 060 A1 | 9/2009 |
| FR | 2 937 464 A1 | 4/2010 |
| WO | WO 2009/112644 A1 | 9/2009 |

* cited by examiner

*Primary Examiner* — Seahvosh Nikmanesh
*Assistant Examiner* — Evren Seven
(74) *Attorney, Agent, or Firm* — Oliff & Berridge, PLC

(57) ABSTRACT

The invention relates to a method for producing chip elements provided with a groove, comprising the following steps: on an interconnect substrate, providing a conductive track arranged to connect a contact area of an active surface of a chip to an area corresponding to a first wall of the groove; growing a contact bump by electrodeposition on the conductive track at the level of the area corresponding to the first wall of the groove; assembling the chip on the substrate via its active surface so that a side wall of the chip forms the bottom of the groove; machining the chip via its rear surface in parallel to the substrate while measuring the distance between the rear surface of the chip and the contact bump; stopping machining when the measured distance reaches a required value; and assembling by bonding a plate to the rear surface of the chip so as to form a second wall of the groove.

4 Claims, 3 Drawing Sheets

METHOD FOR PRODUCING CHIP ELEMENTS EQUIPPED WITH WIRE INSERTION GROOVES

BACKGROUND OF THE INVENTION

The invention relates to microelectronic chip elements, the largest dimension of these elements being able to be smaller than a millimeter, which are secured to conducting wires serving the purpose for example of supplying power to the chips.

STATE OF THE ART

FIG. 1 represents a perspective view of a chip element 10 secured to two parallel wires 12a and 12b, as described in Patent application WO2009112644. Element 10 is of general parallelepipedic shape and two opposite lateral surfaces thereof are provided with respective parallel grooves 14a, 14b which extend over the whole length of element 10. Each of these grooves accommodates a respective wire 12a and 12b.

Wires 12a and 12b generally perform an electric connection role, for example to supply electric current to a light-emitting diode formed in the chip of element 10. Wires 12a and 12b are thus conductive and are electrically connected with the chip by means of a conductive bump 16 formed on a side wall of each groove. The width of the grooves and the height of bumps 16 are selected according to the diameter of wires 12 so that each wire is pinched between the bump and the opposite side wall of groove 14.

An element of the type of FIG. 1 is generally made up of two parts. A first part 18a, corresponding to the bottom third of the element, is formed by the chip. A second part 18b, corresponding to the remaining top part of the element, forms a protective cover. The active surface of the chip, facing towards cover 18b, comprises bumps 16 and forms a first side wall of grooves 14. Cover 18b has a T-shaped cross-section enabling it to form the second side wall and the bottom of the grooves.

On account of the smallness of chip elements 10, assembly of covers 18b on chips 18a gives rise to a certain number of problems. It is in particular difficult to respect the separating distance between the side walls of grooves 14 in reproducible manner. As described in the above-mentioned Patent application WO2009112644, it may be desired for wires 12 to be secure d by flexible pinching in the grooves between bumps 16 on one side and the opposite side walls of the grooves on the other side. If the separating distance is too large, wires 12 are not able to be pinched. If the separating distance is too small, the wires are not able to be inserted in the grooves without breaking element 10.

SUMMARY OF THE INVENTION

Means are therefore sought for whereby a reproducible and precise separating distance between the side walls of the grooves can be ensured.

To tend to meet this requirement, a method for producing chip elements provided with a groove is provided comprising the following steps: on an interconnect substrate, providing a conductive track arranged so as to connect a contact area of an active surface of a chip with an area corresponding to a first wall of the groove; growing a contact bump by electrodeposition on the conductive track at the level of the area corresponding to the first wall of the groove; assembling the chip on the substrate via its active surface so that a side wall of the chip forms the bottom of the groove; machining the chip via its rear surface in parallel to the substrate while measuring the distance between the rear surface of the chip and the contact bump; stopping machining when the measured distance reaches a required value; and assembly by bonding a plate on the rear surface of the chip so as to form a second wall of the groove.

According to one embodiment of the method, the assembly stage comprises the following steps: applying a quantity of polymerizable adhesive to the rear surface of the chip at a liquefaction temperature of the adhesive; applying the plate onto the chip with a pressure such as to obtain a minimum thickness of adhesive between the plate and chip expelling the excess adhesive; and heating the adhesive to a polymerization temperature while maintaining the pressure.

According to one embodiment of the method, the plate or the rear surface of the chip is provided with cavities designed to collect an excess of adhesive expelled by the pressure.

According to one embodiment, the method comprises the following steps: depositing a continuous conductive bottom enhancing electrodeposition, covering the substrate and the conductive track; growing micro-inserts by electrodeposition on the continuous bottom at the level of the conductive track in correspondence with the contact area of the active surface of the chip; growing the contact bump on the continuous bottom; removing the excess continuous bottom; and assembling the chip on the substrate so that its contact area presses on the micro-inserts.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT OF THE INVENTION

Figure 1:
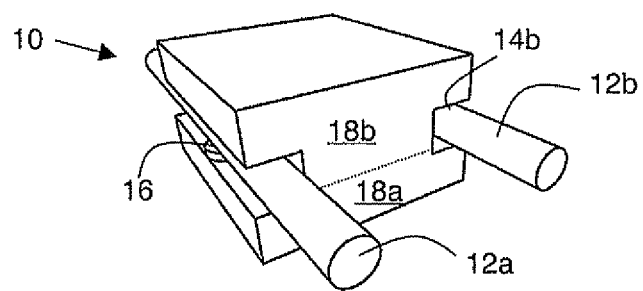
FIG. 1, described in the foregoing, represents a perspective view of a chip element secured to two wires.
Figure 2:
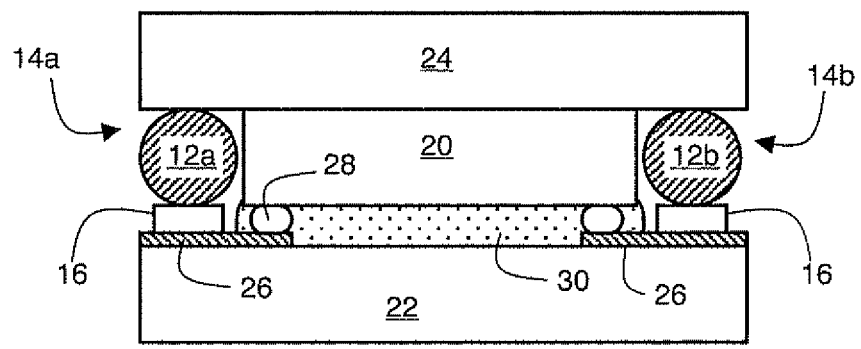
FIG. 2 represents a front view of an embodiment of a chip element comprising a chip connected via its active surface to an interconnect substrate.

FIG. 2 represents an embodiment of a chip element of a particular type for which it is sought to improve the precision of the width of the grooves.

In this chip element, chip 20 is directly connected via its active surface, i.e. the surface where the circuits are made, onto an interconnect substrate 22, according to the technique commonly referred to as flip-chip. The side walls of chip 20 thus form the bottom of grooves 14a and 14b, and the parts of substrate 22 salient with respect to the chip form a first wall of the grooves. The opposite second wall of the grooves is formed by salient parts of a plate 24 fixed by adhesion to the rear surface of chip 20.

Substrate 22 comprises conductive tracks 26, on the top surface thereof, designed to connect contact areas of chip 20 to respective bumps 16 arranged on the first wall of grooves 14. The contact areas of chip 20 are connected to the tracks 26 by means of solder beads 28 or any other means suitable for the flip-chip technique. These solder beads at the same time perform securing of the chip. A coating material 30 fills the space between chip 20 and substrate 22 and embeds beads 28.

As represented, wires 12a and 12b are preferably pinched between bumps 16 and the opposite walls of grooves 14, i.e.

the walls defined by plate 24. As mentioned in the foregoing, if the separating distance between the bumps and the opposite walls is too large, wires 12 are not able to be pinched. If the separating distance is too small, the wires are not able to be inserted in the grooves without breaking the element. The assembly method of the chip element therefore has to guarantee a sufficient precision of this separating distance.

The chain of dimensions between a bump 16 and the opposite wall of the groove comprises numerous elements, in particular bump 16, solder bead 28, chip 20, and the layer of adhesive between chip 20 and plate 24. The sum of dimensional uncertainties of all these elements does not enable the required precision to be achieved in reproducible manner, without particular precautions.

Particular choices in the production method enabling the required precision to be achieved in reproducible manner are proposed here. In particular, contact bumps 16 are produced by electrodeposition. Although it is not accurate by this method, the height of the bumps has the property of being uniform over the whole of a processed wafer. After the chip has been assembled on its substrate, it is grinded via its rear surface while the height between the bump and the rear surface being measured. Grinding is stopped when the measurement corresponds to the required dimension. Measurement is made in conventional manner by means of a comparator or a profilemeter. Plate 24 is then bonded to the rear surface of chip 20 by means of a method enabling a layer of adhesive of minimum thickness to be obtained.

FIGS. 3a to 3e represent various steps in a production method of chip elements of the type of FIG. 2. This method is applicable to production of several chip elements on a silicon wafer designed to form interconnect substrates 22 of the chip elements.

Figure 3A:
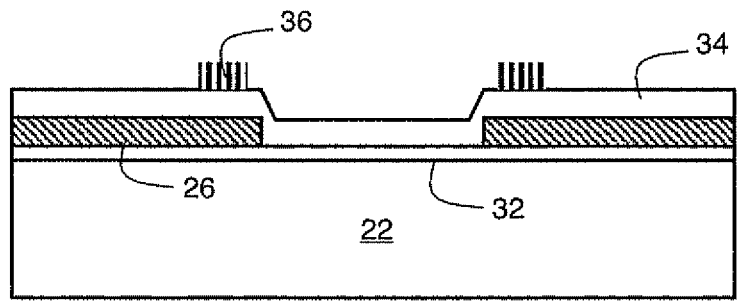
FIGS. 3a to 3e represent steps of producing a chip element of the type of FIG. 2.

In FIG. 3a, substrate 22, for example made from silicon, is covered by a full-wafer insulating layer 32 of silicon oxide on which conducting tracks 26, for example made from aluminurn, have been formed. A full-wafer continuous bottom 34, designed to enhance electrodeposition, for example made from titanium and copper alloy, covers the conductive tracks.

Micro-inserts 36, designed to make the contacts with the chip, have been formed by electrodeposition on continuous bottom 34 at the level of the suitable parts of conductive tracks 26. This constitutes an advantageous alternative to the solder beads to connect the chip to the substrate. This solution enables a thinner interface (between 2 and 10 µm) to be obtained which is therefore less sensitive to moisture (the lateral exchange surface being smaller).

Figure 3B:
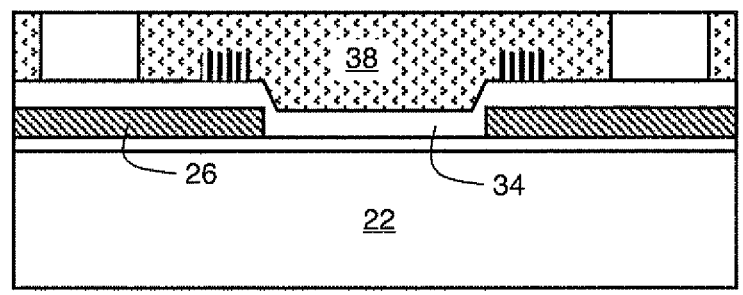

In FIG. 3b, bumps 16 are formed by electrodeposition. For this, a layer of cross-linkable resin 38 is deposited on continuous bottom 34 and is then exposed and etched to remove the resin at the locations of bumps. The bumps are made to grow in these locations by electrodeposition on continuous bottom 34. The height of the bumps depends on the electrodeposition time. The thickness of the resin does not have any influence—it simply has to be greater than the required height of bumps 16.

Electrodeposition is preferably performed with two materials. A layer of nickel is first deposited, for example over 15 µm, followed by a layer of gold, for example over 3 µm, to foster contact with wires 12 (FIG. 2).

Figure 3C:
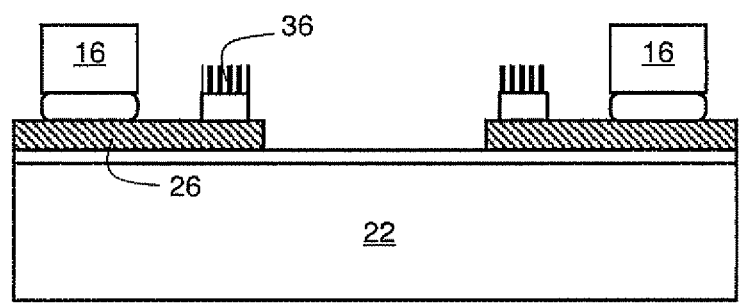

In FIG. 3c, the excess resin and continuous bottom 34 are removed. Bumps 16 and micro-inserts 36 then remain on islands of material of the continuous bottom, in electric contact with tracks 26.

Although the height of bumps 16 cannot be obtained with the required precision, the latter are of uniform height over the whole of the processed wafer.

Figure 3D:
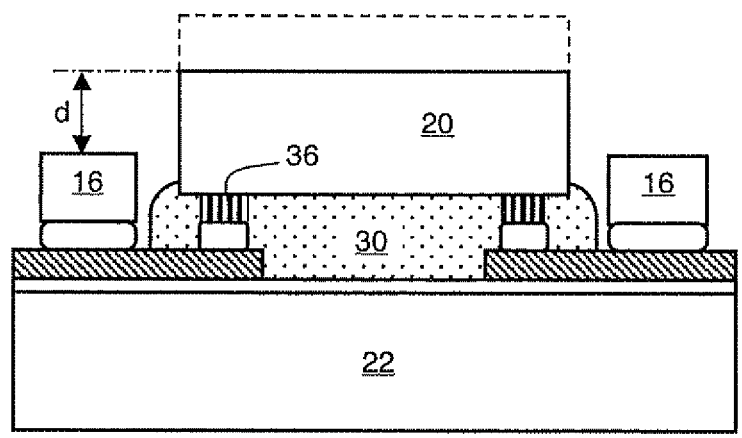

In FIG. 3d, chip 20 is assembled on substrate 22, the contact areas of its active surface being applied on micro-inserts 36. The contacts are established by exerting a sufficient pressure on the chip for the micro-inserts to partially enter the contact areas of the chip. Coating material 30 is added in the space between chip 20 and substrate 22. This coating material, here also serving the purpose of fixing the chip on the substrate, is preferably a polymerizable glue or resin.

The height of chip 20 is then reduced from its rear surface by grinding, or any other suitable form of machining. The initial height of the chip is represented in broken lines. During the grinding phase, the distance between the rear surface of the chip and the apex of bumps 16 is measured. Grinding is stopped when the required distance d is reached. This distance corresponds to the diameter of wire 12 to be inserted in the grooves. Current machining tools enable such a distance to be monitored and to be respected with a precision that is amply sufficient for the requirements described here.

Figure 3E:
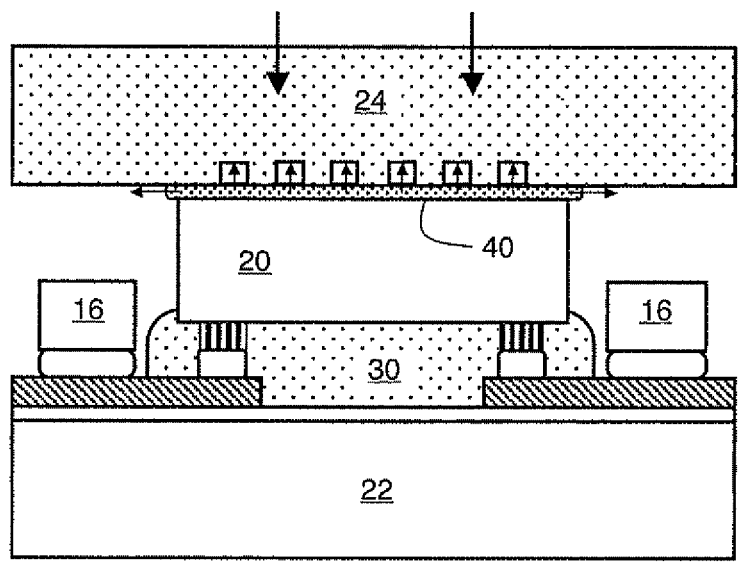

In FIG. 3e, plate 24, for example made from glass, is added onto the rear surface of chip 20 by bonding. It is desirable for adhesive seal 40 to be of minimum thickness so that its dispersions have little influence on the final distance obtained between bumps 16 and plate 24. For this, adhesion by thermocompression is performed.

A drop of suitably dosed adhesive (for example epoxy E505—EPOTECNY) is deposited on the rear surface of chip 20, or a uniform layer is spin-coated on plate 24. Dosing of the adhesive is preferably such that it covers the whole of the top surface of chip 20 without however overspilling onto bumps 16 after adhesion.

Plate 24 is applied on chip 20 with sufficient pressure to expel a large part of the adhesive to the edges of the chip. The pressure is maintained during the hardening phase of the adhesive, which preferably comprises two temperature plateaus. A first plateau, between 50 and 90° C. for 10 to 30 min for E505 resin, is designed to liquefy the adhesive and facilitate migration thereof. A second plateau, above 90° for 10 to 60 min, is designed to polymerize the adhesive.

To further facilitate reduction of the thickness of this adhesive seal, as represented, cavities are provided in the bottom surface of plate 24. Such cavities, for example in the form of grooves made by using a saw, could also be provided on the rear surface of chip 20. These cavities, by accumulating the excess adhesive, enable the migration path of the expelled adhesive to be shortened.

With these different measures, a thickness of the adhesive seal of about 1 µm is obtained, reproducible with a considerably lower dimensional tolerance than that required for the separating distance between bumps 16 and plate 24.

It can be observed that the different steps of FIGS. 3a to 3e, although they have been described in relation to a single chip element, advantageously apply to a matrix of chip elements made from a wafer forming substrates 20. The grinding operation is performed on the set of assembled chips 20. Plate 24, of the same size as the matrix, is applied on the set of chips 20. The chip elements are finally separated by dicing.

The invention claimed is:

1. A method for producing chip elements provided with a groove, comprising the following steps:
   on an interconnect substrate, providing a conductive track arranged to connect a contact area of an active surface of a chip to an area corresponding to a first wall of the groove;
   depositing a continuous conductive bottom enhancing electro-deposition, covering the substrate and conductive track;

growing micro-inserts by electrodeposition on the continuous bottom at a level of the conductive track in correspondence with the contact area of the active surface of the chip;

growing a contact bump by electrodeposition on the conductive track at a level of the area corresponding to the first wall of the groove;

removing the excess continuous bottom;

assembling the chip on the substrate via the active surface of the chip so that the contact area of the chip presses on the micro-inserts and so that a side wall of the chip forms a bottom of the groove;

machining the chip via a rear surface of the chip in parallel to the substrate while measuring a distance between the rear surface of the chip and the contact bump;

stopping machining when the measured distance reaches a required value; and assembling the groove by bonding a plate to the rear surface of the chip so as to form a second wall of the groove.

2. The method according to claim 1, wherein assembling the groove comprises the following steps:

applying a quantity of polymerizable adhesive to the rear surface of the chip at a liquefaction temperature of the adhesive;

applying the plate onto the chip with a pressure such as to obtain a minimum thickness of adhesive between the plate and the chip expelling an excess of adhesive; and heating the adhesive to a polymerization temperature while maintaining the pressure.

3. The method according to claim 2, wherein the plate or the rear surface of the chip is provided with cavities designed to collect the excess of adhesive expelled by the pressure.

4. The method according to claim 1, wherein a wire is pinched between the contact bump and the second wall of the groove.

* * * * *